(12) United States Patent
Chen

(10) Patent No.: US 9,496,452 B2
(45) Date of Patent: Nov. 15, 2016

(54) METHOD OF ABSORBER SURFACE REPAIRING BY SOLUTION PROCESS

(71) Applicant: TSMC Solar Ltd., Taichung (TW)

(72) Inventor: Shih-Wei Chen, Kaohsiung (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 14/517,959

(22) Filed: Oct. 20, 2014

(65) Prior Publication Data

US 2016/0111585 A1    Apr. 21, 2016

(51) Int. Cl.
*H01L 31/0749* (2012.01)
*H01L 31/18* (2006.01)
*H01L 31/032* (2006.01)
*H01L 21/02* (2006.01)

(52) U.S. Cl.
CPC ....... *H01L 31/186* (2013.01); *H01L 21/02557* (2013.01); *H01L 21/02628* (2013.01); *H01L 31/0322* (2013.01); *H01L 31/0749* (2013.01)

(58) Field of Classification Search
CPC ................ H01L 21/02365; H01L 21/02518; H01L 21/02623
See application file for complete search history.

(56) References Cited

U.S. PATENT DOCUMENTS

2011/0120557 A1* 5/2011 Suh .................. H01L 21/02422
136/262

* cited by examiner

*Primary Examiner* — Cheung Lee
(74) *Attorney, Agent, or Firm* — Duane Morris LLP

(57) ABSTRACT

Methods and systems for repairing oxidation of CIGS surfaces during manufacture of a CIGS solar cell are generally disclosed. Oxidation of an absorber reduces the photoluminescence intensity of the CIGS surface. The absorber is immersed in a reduction tank having a reducing reagent therein. The reducing reagent reverses the oxidation of the CIGS absorber, increasing the interface quality and corresponding photoluminescence intensity. After reversing the oxidation, a buffer layer is deposited on the CIGS absorber to prevent further surface oxidation.

19 Claims, 9 Drawing Sheets

METHOD OF ABSORBER SURFACE REPAIRING BY SOLUTION PROCESS

BACKGROUND

This disclosure relates to thin film photovoltaic solar cells.

In a copper/gallium/selenium ("CIGS") thin film solar cell, the thin film stack generally comprises a substrate, a molybdenum ("Mo") thin film layer as a back contact layer (a.k.a., back electrode), and a CIGS thin film layer as the absorber layer. The structure can further include a buffer layer of CdS, for example. The buffer layer is followed by a front contact (a.k.a., front electrode layer or transparent conductive oxide, TCO, layer). Such conventional structure is formed by first depositing the molybdenum thin film layer over the substrate. The CIGS thin film absorber layer is formed by deposition of a Cu/In/Ga (CIG) intermetallic precursor layer on the Mo thin film layer and followed by selenization and optionally sulfurization of the CIG precursor in a furnace, thus, converting the CIG precursor layer into the final CIGS layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
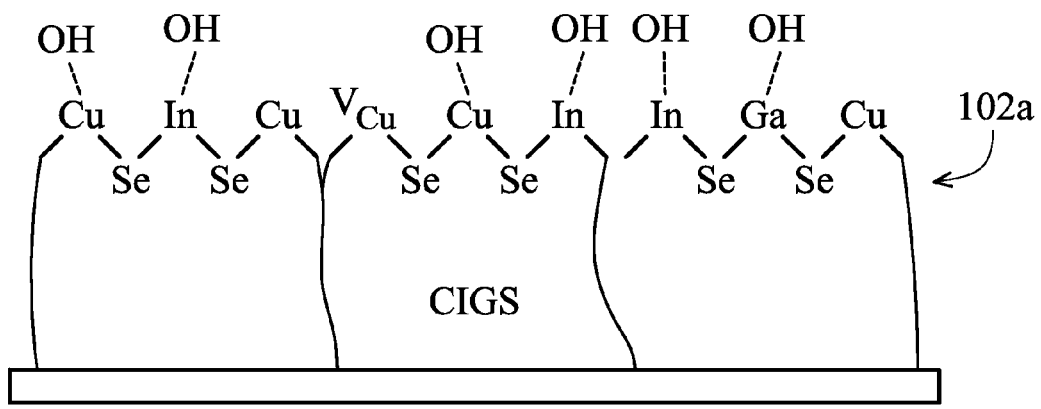
FIG. 1A illustrates surface oxidation behavior of a CIGS layer in a system terminating with a cation, in accordance with some embodiments.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

When a solar cell is fabricated, the CIGS absorber surface can gradually trap oxygen, for example, by forming Se—O bonds, causing the CIGS layer to oxidize when the absorber leaves a vacuum chamber. The surface oxidation behavior can damage the interface quality of the CIGS absorber.

The present disclosure generally provides methods and systems for repairing oxidation of CIGS surfaces during manufacture of a CIGS solar cell. Generally, when a CIGS absorber is exposed to atmosphere, oxidation of the CIGS surface occurs and reduces the interface quality of the absorber. The reduced interface quality can be measured by a reduced photoluminescence (PL) intensity. According to some embodiments disclosed herein, the absorber is immersed in a reducing reagent to restore the PL intensity of the absorber. The reducing agent reverses the oxidation of the CIGS surface and increases the PL intensity of the absorber. After restoring the CIGS surface, a buffer layer can be deposited on the absorber to prevent further surface oxidation.

Figure 9:
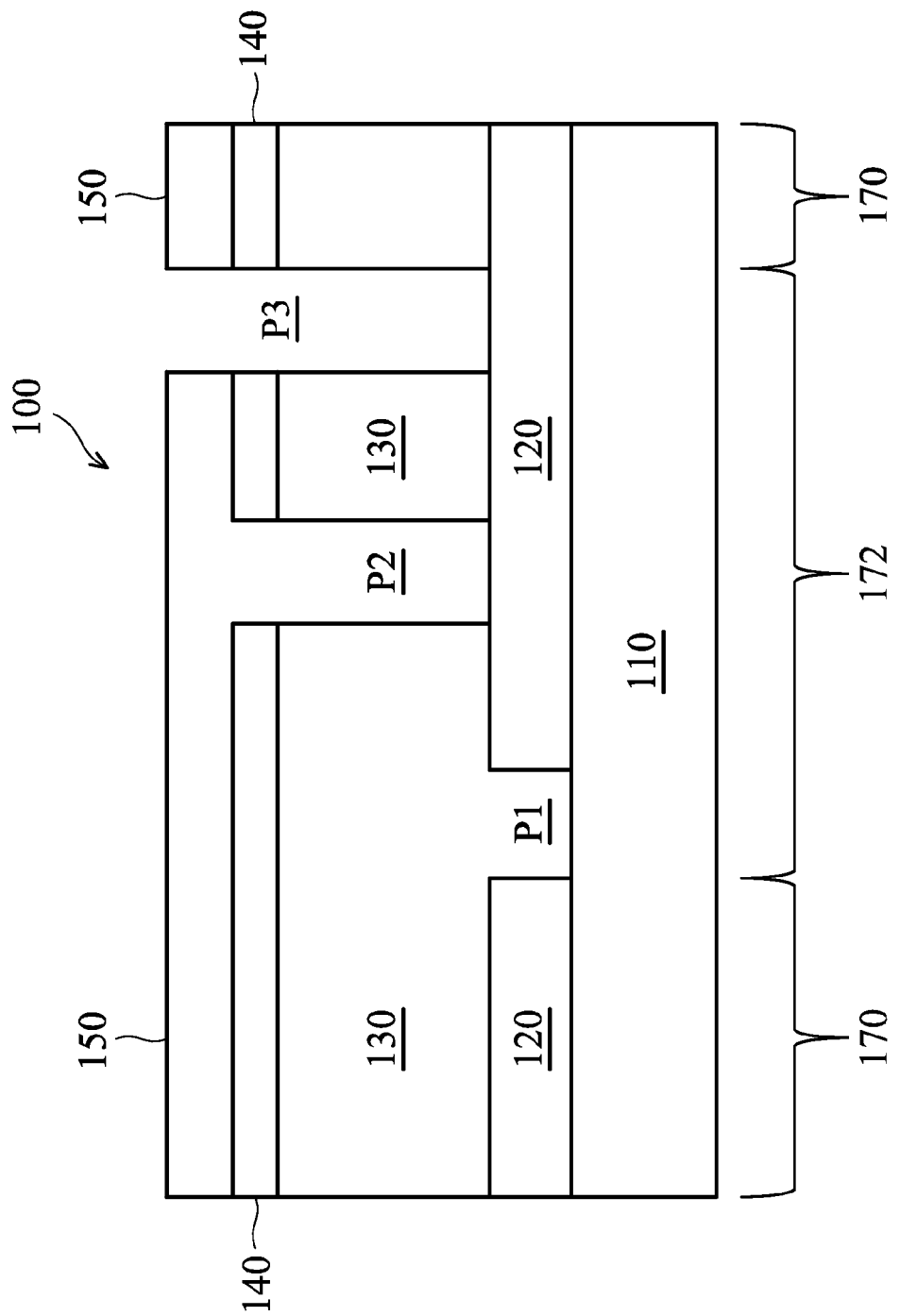
FIG. 9 is a cross-sectional view of a solar cell in accordance with some embodiments.

FIG. 9 is a cross-sectional view of a solar cell according to some embodiments. The portion of the solar panel 100 shown in FIG. 9 includes an interconnect structure 172, which provides a series connection between two adjacent solar cells of the panel 100. In FIG. 9, the width of the interconnect structure 172 is exaggerated relative to the width of the collection region 170 for clarity, but the collection region 170 is actually much wider than the interconnect structure 172.

The solar cell 100 includes a solar cell substrate 110, a back contact layer 120, an absorber layer 130, a buffer layer 140 and a front contact layer 150.

Substrate 110 can include any suitable substrate material, such as glass. In some embodiments, substrate 110 includes a glass substrate, such as soda lime glass, or a flexible metal foil, or a polymer (e.g., a polyimide, polyethylene terephthalate (PET), polyethylene naphthalene (PEN)). Other embodiments include still other substrate materials.

Back contact layer 120 includes any suitable back contact material, such as metal. In some embodiments, back contact layer 120 can include molybdenum (Mo), platinum (Pt), gold (Au), silver (Ag), nickel (Ni), or copper (Cu). Other embodiments include still other back contact materials. In some embodiments, the back contact layer 120 is from about 50 nm to about 2 μm thick.

In some embodiments, absorber layer 130 includes any suitable absorber material, such as a p-type semiconductor. In some embodiments, the absorber layer 130 can include a chalcopyrite-based material comprising, for example, $Cu(In,Ga)Se_2$ (CIGS), cadmium telluride (CdTe), $CuInSe_2$ (CIS), $CuGaSe_2$ (CGS), $Cu(In,Ga)Se_2$ (CIGS), $Cu(In,Ga)(Se,S)_2$ (CIGSS), CdTe or amorphous silicon. Other embodiments include still other absorber materials. In some embodiments, the absorber layer 140 is from about 0.3 μm to about 8 μm thick.

The buffer layer 140 is deposited on the absorber 130 to form a p/n junction. The buffer layer 140 can include any suitable buffer material, such as n-type semiconductors. In some embodiments, buffer layer 140 can include cadmium sulphide (CdS), zinc sulphide (ZnS), zinc selenide (ZnSe), indium sulfide ($In_2S_3$), indium selenide ($In_2Se_3$), or $Zn_{1-x}Mg_xO$, (e.g., ZnO). Other embodiments include still other buffer materials. In some embodiments, the buffer layer 140 is from about 1 nm to about 500 nm thick.

In some embodiments, front contact layer 150 includes an annealed transparent conductive oxide (TCO) layer of constant thickness of about 100 nm or greater. The terms "front contact" and "TCO layer" are used interchangeably herein; the former term referring to the function of the layer 150, and the latter term referring to its composition. In some embodiments, the charge carrier density of the TCO layer 150 can be from about $1\times10^{17}$ cm$^{-3}$ to about $1\times10^{18}$ cm$^{-3}$. The TCO material for the annealed TCO layer can include suitable front contact materials, such as metal oxides and metal oxide precursors. In some embodiments, the TCO material can include AZO, GZO, AGZO, BZO or the like) AZO: alumina doped ZnO; GZO: gallium doped ZnO; AGZO: alumina and gallium co-doped ZnO; BZO: boron doped ZnO. In other embodiments, the TCO material can be cadmium oxide (CdO), indium oxide ($In_2O_3$), tin dioxide ($SnO_2$), tantalum pentoxide ($Ta_2O_5$), gallium indium oxide ($GaInO_3$), ($CdSb_2O_3$), or indium oxide (ITO). The TCO material can also be doped with a suitable dopant.

In some embodiments, in the doped TCO layer 150, $SnO_2$ can be doped with antimony, (Sb), flourine (F), arsenic (As), niobium (Nb) or tantalum (Ta). In some embodiments, ZnO can be doped with any of aluminum (Al), gallium (Ga), boron (B), indium (In), yttrium (Y), scandium (Sc), fluorine (F), vanadium (V), silicon (Si), germanium (Ge), titanium (Ti), zirconium (Zr), hafnium (Hf), magnesium (Mg), arsenic (As), or hydrogen (H). In other embodiments, $SnO_2$ can be doped with antimony (Sb), F, As, niobium (Nb), or tantalum (Ta). In other embodiments, $In_2O_3$ can be doped with tin (Sn), Mo, Ta, tungsten (W), Zr, F, Ge, Nb, Hf, or Mg. In other embodiments, CdO can be doped with In or Sn. In other embodiments, $GaInO_3$ can be doped with Sn or Ge. In other embodiments, $CdSb_2O_3$ can be doped with Y. In other embodiments, ITO can be doped with Sn. Other embodiments include still other TCO materials and corresponding dopants.

In some embodiments, a plurality of solar cells 100 are arranged adjacent to each other, with the front contact 150 of each solar cell conducting current to the next adjacent solar cell. Each solar cell 100 includes an interconnect structure 172 for conveying charge carriers from the front contact 150 of a solar cell to the back contact 120 of the next adjacent solar cell on the same panel. The layers 120, 130, 140 and 150 are provided in the collection regions 170. The interconnect structure 172 also includes three lines, referred to as P1, P2, and P3. The P1 scribe line extends through the back contact layer 130 and is filled with the absorber layer material. The P2 scribe line extends through the buffer layer 140 and the absorber layer 130, and contacts the back contact 120 of the next adjacent solar cell, thus connecting adjacent solar cells in series. The P3 line extends through the front contact layer 150, buffer layer 140 and absorber layer 130. The P3 line of the adjacent solar cell is immediately to the left of the collection region 170 of the solar cell 100.

The P3 line separates the front contacts 150, buffer layers 140 and absorber layers 130 of adjacent solar cells, so that each front contact can transmit current through the P2 scribe line to the back contact of the next adjacent solar cell without shorting between front adjacent contacts.

FIG. 1A illustrates a CIGS absorber 102a terminating in a plurality of cations 104, which include copper, indium and gallium ions, prior to deposition of the buffer layer 140. When the CIGS absorber 102a is exposed to the atmosphere, oxygen bonds with the copper, iridium, and gallium cations 104 of the CIGS absorber 102a surface. The CIGS absorber 102a experiences surface oxidation 106. The resulting oxidized surface is shown as the oxidized CIGS absorber 102b in FIG. 1B. The bonded oxygen reduces the interface quality of the absorber 102b.

Figure 1B:
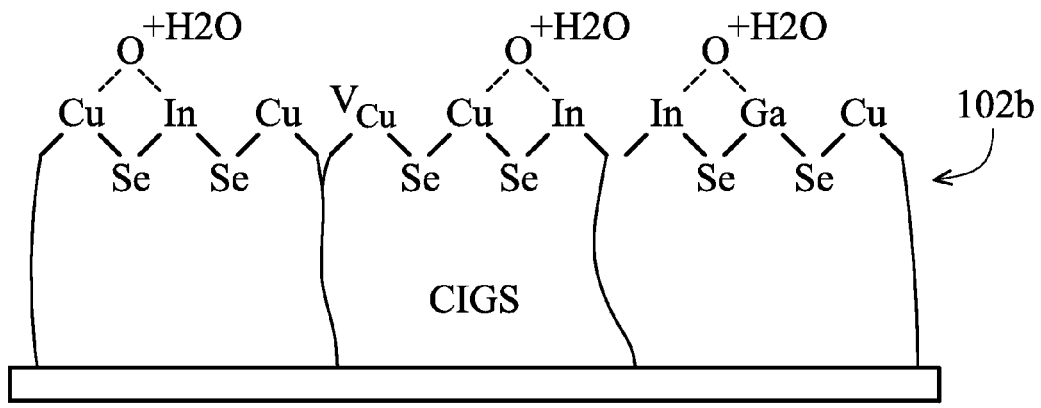
FIG. 1B illustrates the CIGS layer of FIG. 1A in an oxidized state.
Figure 1C:
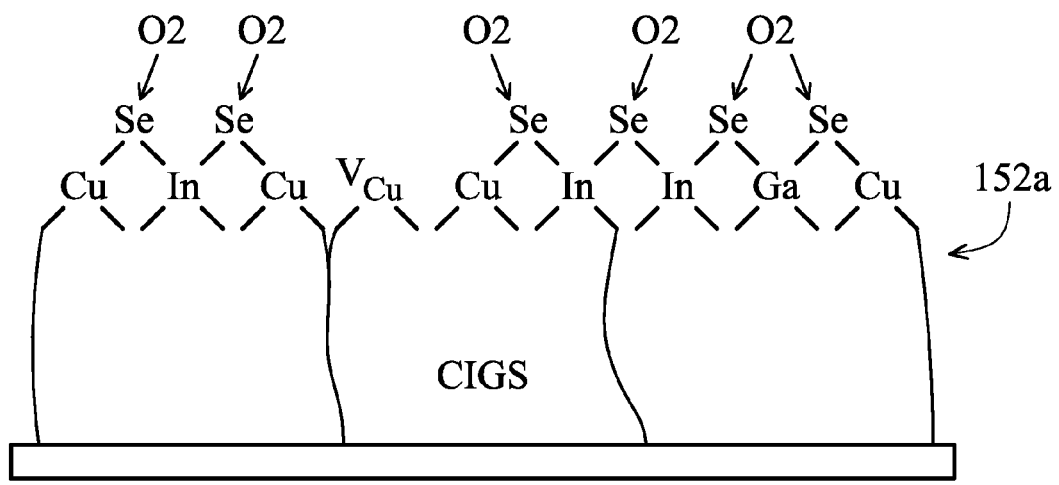
FIG. 1C illustrates surface oxidation behavior of a CIGS layer in a system terminating with an anion, in accordance with some embodiments.
Figure 1D:
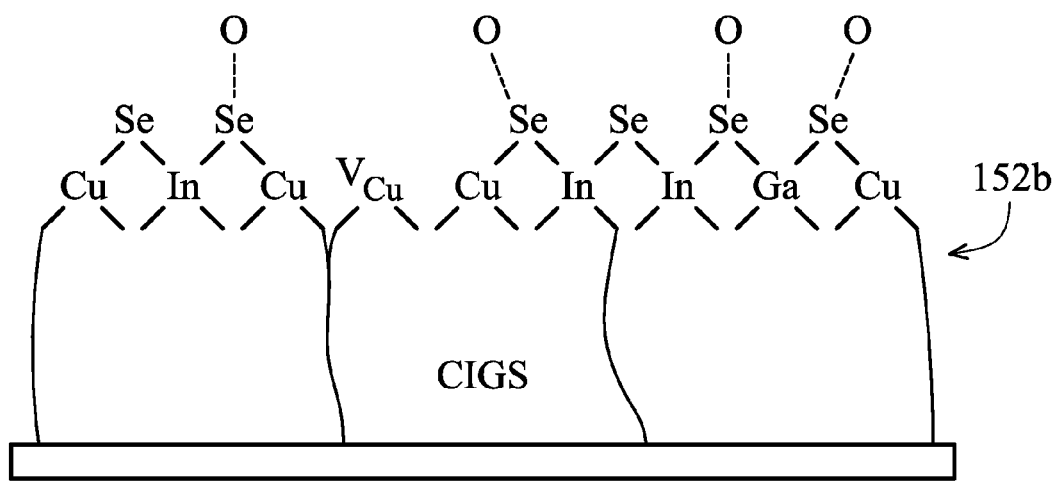
FIG. 1D illustrates the CIGS layer of FIG. 1C in an oxidized state.

FIG. 1C illustrates a CIGS surface 152a terminating in a plurality of selenium anions 154. When the CIGS surface 152a is exposed to surface oxidation, oxygen bonds with the selenium of the CIGS absorber. The resulting oxidized absorber is shown in FIG. 1D. The oxidized selenium reduces the interface quality of the absorber 152b.

In the absorbers shown in FIGS. 1B and 1D, the reduced interface quality of an absorber surface 102b, 152b results in a reduced photoluminescence (PL) intensity. Reduced photoluminescence is an indication of reduced solar cell efficiency. The emission is caused by a band-to-band transition, and indicates the minority carrier diffusion length. A long minority carrier diffusion length causes brighter luminescence and higher photon conversion efficiency.

Figure 2:
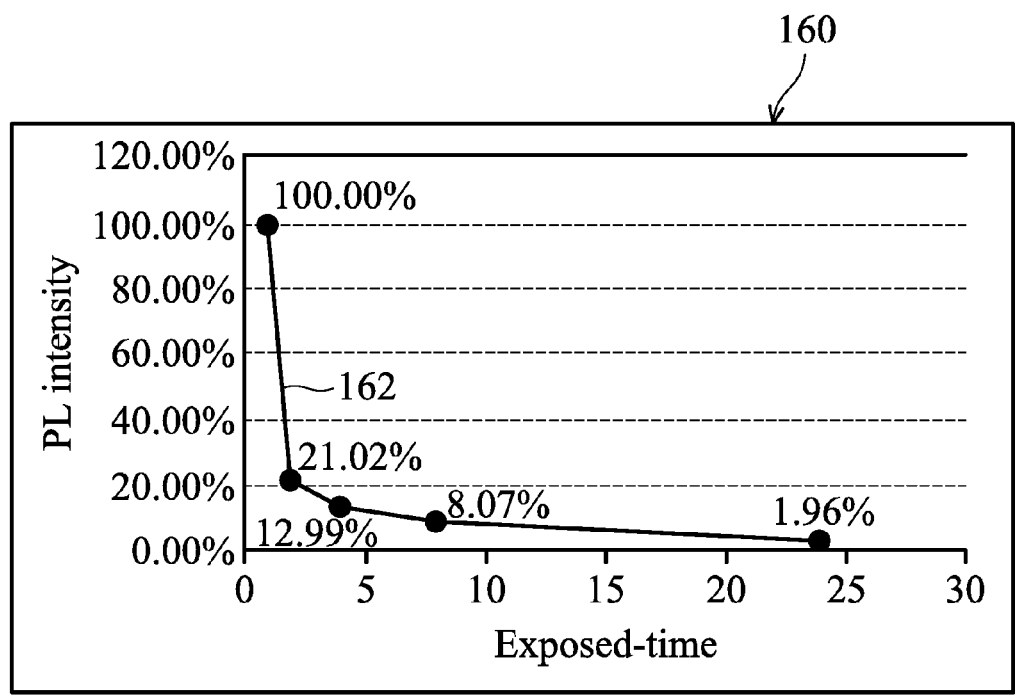
FIG. 2 is a chart illustrating photoluminescence (PL) degradation of a CIGS surface due to surface oxidation, in accordance with some embodiments.

FIG. 2 is a chart 160 illustrating the change in PL intensity 162 of a CIGS absorber due to surface oxidation. In the illustrated embodiment, the PL intensity is normalized such that the PL intensity of a fresh absorber is 100% PL intensity and oxidized absorbers are shown as a percentage of the fresh absorber PL intensity. When an absorber 102a is exposed to air, surface oxidation occurs and the amount of oxidation will rapidly increase with exposure time. Absorber surface quality can be detected by a PL system. For example, in one embodiment, laser illumination is applied to the absorber surface. The laser illumination excites the absorber surface's electron holes/pairs. When a hole and/or electron recombines, a photon is released. A stronger PL intensity corresponds to better surface quality and is related to better efficiency. As shown in FIG. 2, PL intensity 162 of a CIGS surface rapidly degrades within the first few hours of exposure. The PL intensity 162 continues to degrade as the exposure time increases. The PL intensity 162 degradation is a result of surface oxidation of the CIGS absorber.

Figure 3:
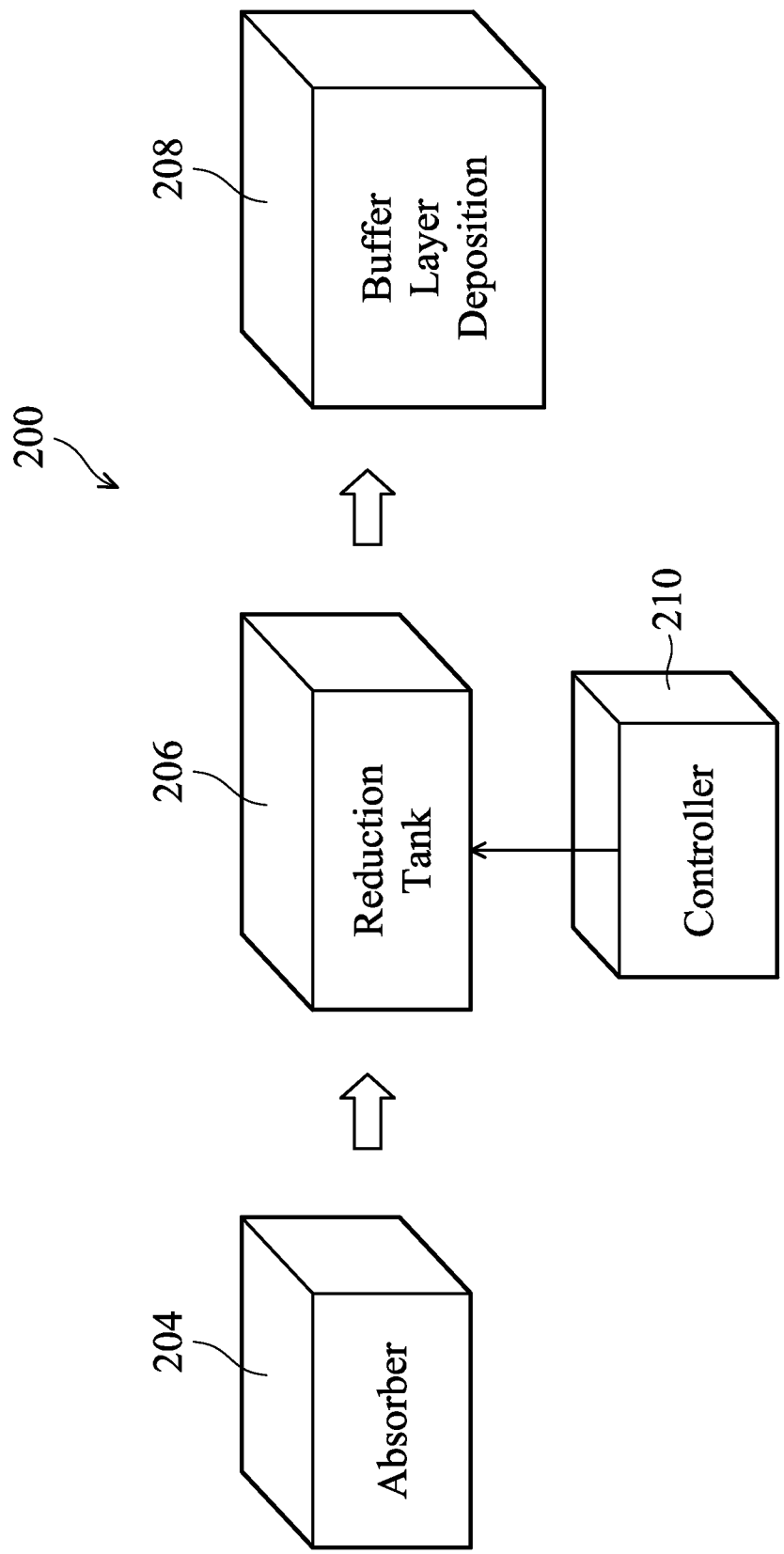
FIG. 3 illustrates a partial solar cell formation process according to some embodiments of the present disclosure.

FIG. 3 is a schematic diagram illustrating a process for restoring an oxidized absorber surface. In one embodiment, a CIGS absorber 204 is formed. The absorber 204 may be formed by any suitable method such as, for example, a vacuum method, a co-evaporation process, a two-step process, a solution process, and/or any other suitable absorber formation process. After formation, the absorber 204 can be exposed to atmosphere (or air), for example, by removing the absorber 204 from a vacuum used for absorber formation. Exposure of the absorber 204 to air causes surface oxidation of the absorber 204, which reduces the interface quality and corresponding PL intensity of the absorber 204. In order to restore interface quality of the absorber 204, the absorber 204 is immersed in a reduction tank 206 having a reduction reagent therein. A controller 210 is configured to control the amount of time the absorber 204 is immersed in the reduction tank 206. In various embodiments, the controller 210 can be configured to control the amount of time the absorber 204 is immersed based on one or more parameters of the reduction tank 206, such as, for example, the reduction agent in the tank 206, the temperature of the reduction agent, the pH of the reduction agent, the concentration of the reduction agent, and/or one or more additional parameters.

The reduction reagent composition is selected to reverse the surface oxidation of the absorber 204. In other words, the reduction reagent deoxidizes the absorber 204. For example, in some embodiments, a reduction reagent comprises a material configured to absorb one or more electrons through a redox process, stripping oxygen from the surface of the absorber 204. Reduction reagents may include, for example, phosphorous (P) or sulfur (S) based reagents. Example reduction reagents include, but are not limited to, sodium sulfite ($Na_2SO_3$), sodium dithionite ($Na_2S_2O_4$), sodium metabisulfite ($Na_2S_2O_5$), sodium phosphinate ($NaH_2PO_2$), Thioreau ($H_2NCSNH_2$), to name just a few. Those skilled in the art will recognize that other suitable reduction reagents are not listed and are included within the scope of the disclosure.

Figure 4:
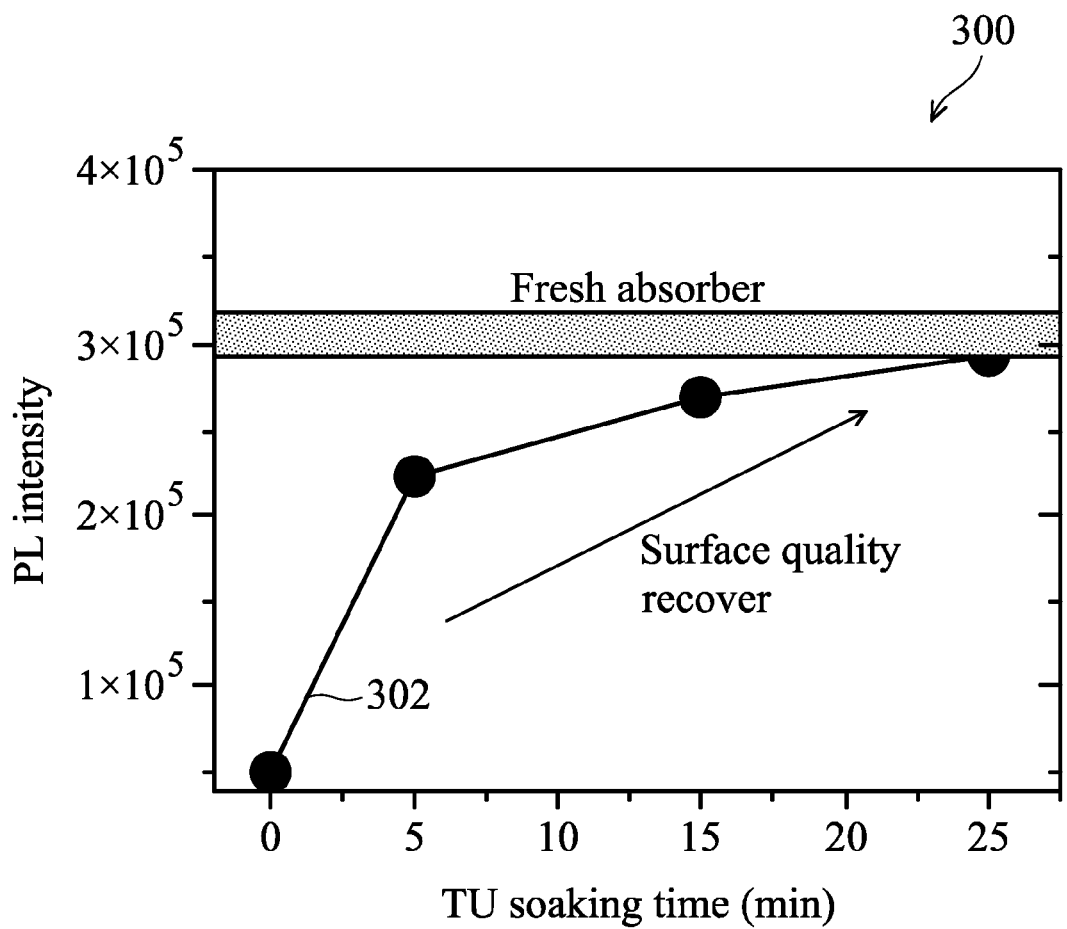
FIG. 4 is a chart illustrating PL intensity change over a period of time according to some embodiments of the present disclosure.

When the absorber 204 is immersed in the reduction reagent, oxidation of the CIGS absorber 204 is reversed. Reversal of the surface oxidation produces a corresponding increase in PL intensity of the absorber 204. FIG. 4 is a chart 300 illustrating the change in PL intensity 302 of an absorber immersed in a Thioreau (TU)-based reagent solution. As shown in FIG. 4, immersion of the absorber 204 increases the PL intensity 302 of the absorber 204. Starting at a time 0, the absorber 204 has a PL intensity substantially equal to zero, that is, the absorber 204 is almost entirely oxidized. Immersion of the absorber 204 increases the PL intensity 302, with longer immersion times producing greater PL intensity 302 increases. For example, in the illustrated embodiment, after about 25 minutes, the PL intensity 302 of the absorber is substantially equal to a PL intensity of a fresh absorber, or about $3 \times 10^5$.

Figure 5:
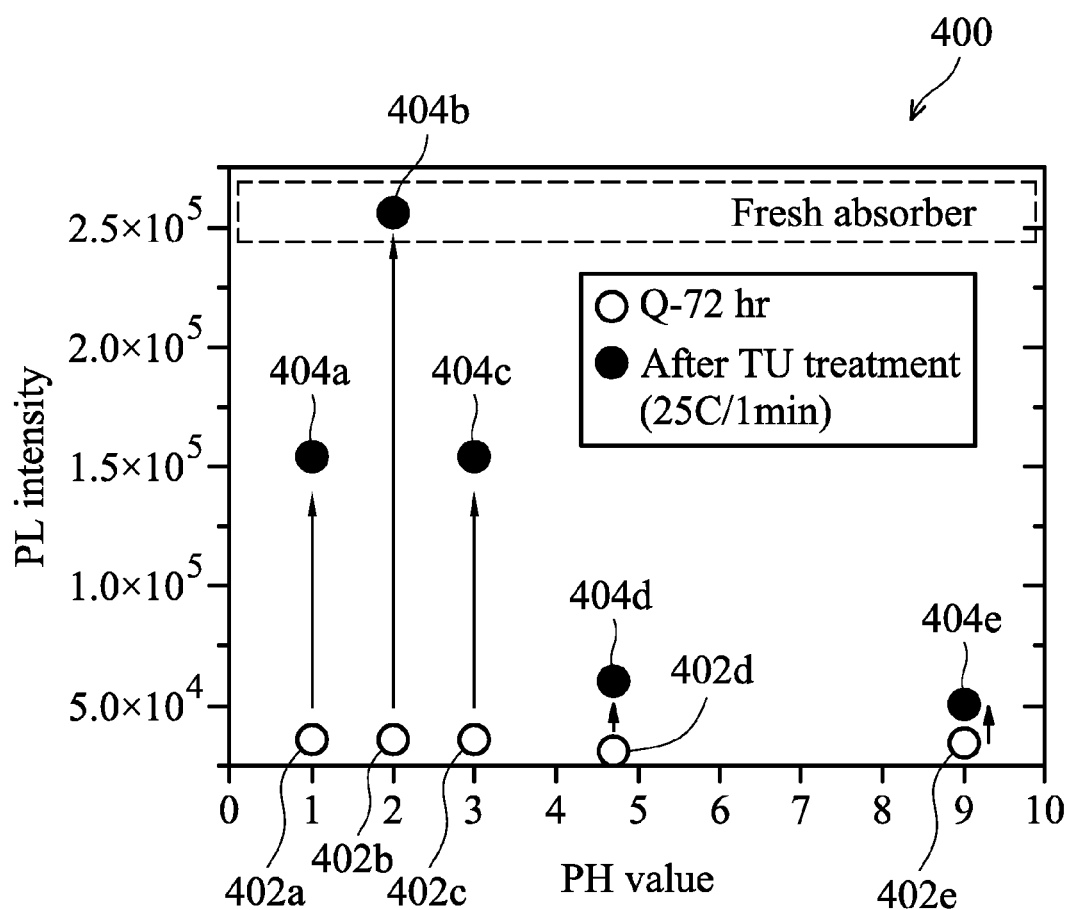
FIG. 5 is a chart illustrating PL intensity change corresponding to a plurality of pH values according to some embodiments of the present disclosure.

In some embodiments, one or more parameters of the reduction reagent may be adjusted to effect the rate of change in the PL intensity. For example, in various embodiments, the temperature, pH, concentration, immersion time, and/or other parameters of a reduction reagent may affect the rate of change in the PL intensity. FIG. 5 is a histogram 400 illustrating various pH values for a TU-based reagent solution. For each pH value, the solution is a TU-based solution at 25° C., having a 1M concentration. Change in PL intensity is shown for an oxidized absorber immersed for one minute in each of the solutions. A first set of PL intensity values 402a-402e correspond to the PL intensity of oxidized absorbers prior to treatment. The oxidized absorbers are exposed to the TU-based reagent solution and the resulting PL intensities 404a-404e after one minute of immersion are shown. As shown in FIG. 5, generally acidic, or lower, pH values produce better restorative results than higher pH values. A pH value of about 2 produces a PL intensity 404b substantially equal to a fresh absorber for the TU-based reagent solution. Although a TU-based reagent solution was used, it will be recognized that one or more properties, such as temperature, pH, concentration, immersion time, and/or additional properties can be adjusted for additional and/or alternative reagents to optimize the PL intensity response.

In one example, the reduction tank has a reduction agent temperature from 25° C. to 90° C., the concentration of the reduction agent is in a range from 0.05M to 5M, the solvent is one of the group consisting of deionized water, ethanol, or isopropanol, the immersion time is in a range from one minute to 30 minutes, and the pH of the reduction agent is in a range from 1 to 7. In some embodiments, the pH of the reduction agent is in a range from 1 to 5. In some embodiments, the pH of the reduction agent is in a range from 2 to 3.

Figure 6:
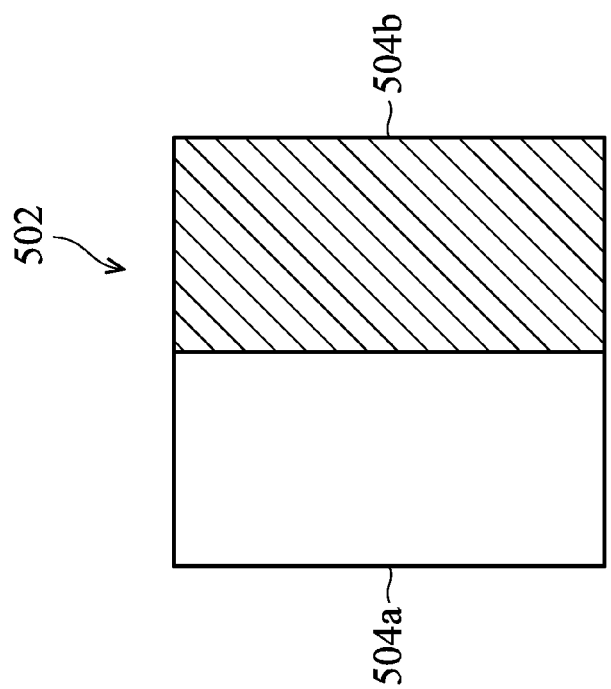
FIG. 6 illustrates one embodiment of an oxidized absorber having a first side restored according to some embodiments of the present disclosure.

FIG. 6 illustrates an embodiment of an oxidized absorber 500 having a first side 502a restored according to various embodiments of the disclosure. The first side 502a is treated with a reduction reagent and a second side 502b is left untreated. During testing, the first side 502a showed significant improvement in PL intensity over the second, untreated side 502b. Table 1 shows a change in panel factors following an absorber reduction treatment as disclosed herein. As can be seen in Table 1, the performance in all measured categories increases after the absorber reduction immersion treatment. In Table 1, Jsc is short-circuit current, Voc is open-circuit voltage, FF is fill factor, Rs is series resistance, and Rsh is shunt resistance.

TABLE 1

|  | Without Reduction | With Reduction |
| --- | --- | --- |
| Efficiency (%) | 8.20 | 14.93 |
| Jsc (mA/cm2) | 35.46 | 36.90 |
| Voc (mV) | 443 | 639 |
| FF | 0.52 | 0.63 |
| Rs (Ωcm2) | 3.72 | 2.87 |
| Rsh (Ωcm2) | 227.64 | 521 |

Figure 7:
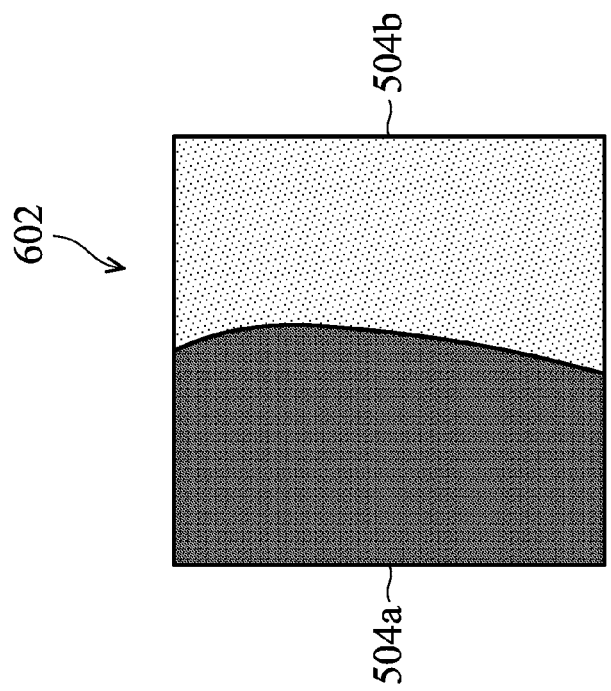
FIG. 7 illustrates one embodiment of a photovoltaic response of the absorber of FIG. 6, in accordance with some embodiments.

FIG. 7 illustrates an EL image 600 of the absorber 500 of FIG. 6. The EL image 600 illustrates the photo response of the treated side 502a and the untreated side 502b of the absorber 500. As shown in FIG. 7, the untreated side 502b is darker, indicating a lower PL intensity and greater oxidation. The treated side 502a is brighter and illustrates the increased PL intensity.

Figure 8:
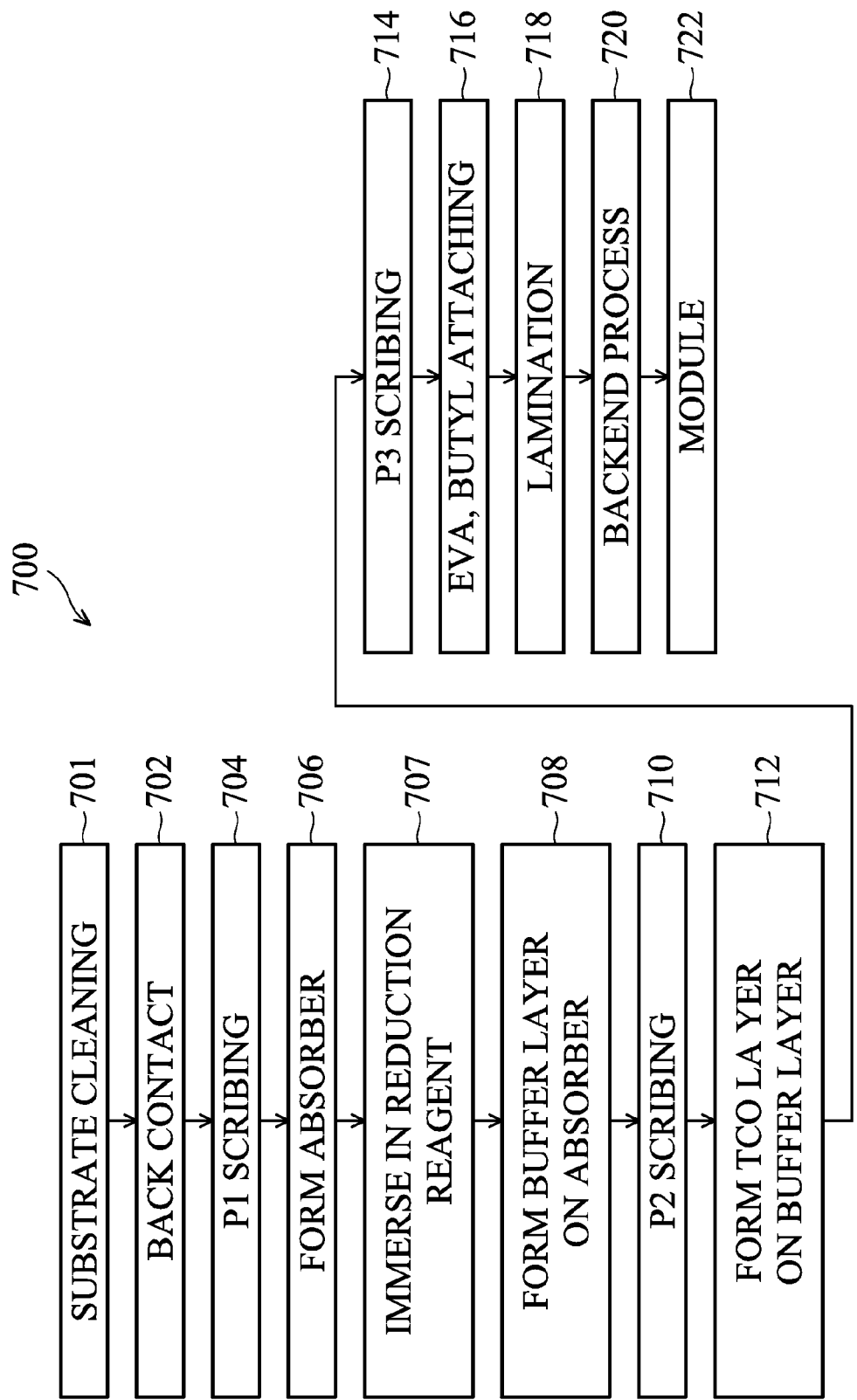
FIG. 8 illustrates one embodiment of a method for restoring an oxidized CIGS absorber, in accordance with some embodiments.

FIG. 8 illustrates one embodiment of a method 700 for forming a CIGS solar cell according to some embodiments of the disclosure. At step 701, the substrate is cleaned. In some embodiments, substrate 110 is cleaned by using detergent or chemical in either brushing tool or ultrasonic cleaning tool.

At step 702, back electrode layer 120 is then formed on a substrate 110 by sputtering, atomic layer deposition (ALD), chemical vapor deposition (CVD), or other suitable techniques.

At step 704, the P1 patterned scribe lines are next formed in bottom electrode layer 120 to expose the top surface of substrate 110 as shown. Any suitable scribing method can be used such as, without limitation, mechanical scribing with a stylus or laser scribing.

At step 706, the p-type doped CIGS semiconductor light absorber layer 130 is next formed on top of bottom electrode layer 120. The absorber layer 130 material further fills the P1 scribe line and contacts the exposed top surface of substrate 110 to interconnect layer 130 to the substrate. Absorber layer 130 formed of CIGS can be formed by any suitable vacuum or non-vacuum process. Such processes include, without limitation, selenization, sulfurization after selenization ("SAS"), evaporation, co-evaporation, sputtering, electrodeposition, chemical vapor deposition, or ink spraying, a two-step process, a solution process, and/or any other suitable process. In some embodiments, the CIGS absorber is formed in a vacuum chamber.

After formation, the CIGS absorber can be removed from the vacuum chamber and can be exposed to oxygen. Oxidation of the CIGS absorber may occur, for example, during storage and/or transportation of the solar cell. For example, in some embodiments, the solar cell is formed in a batch process with one or more additional solar cells. The solar cell may be stored for a period time, such as, for example, several hours, while additional solar cells are formed. Once all of the solar cells in the batch are formed, oxidation of previously formed solar cells may be reduced.

The interface quality and corresponding PL intensity of the absorber is reduced by the surface oxidation. In a third step 707, the solar cell is immersed in a reduction reagent. The reduction reagent is configured to deoxidize the CIGS absorber. The reduction reagent can comprise any suitable reduction reagent, such as, for example, a phosphorous or sulfur based reagent. Examples of suitable reagents include, but are not limited to, sodium sulfite, sodium dithionite, sodium metabisulfite, sodium phosphinate, and Thiourea. The solar cell is immersed for a predetermined time period sufficient to restore the CIGS absorber to a PL intensity substantially equal to the PL intensity of the CIGS absorber prior to the CIGS absorber being removed from the vacuum chamber. For example, the PL intensity can recover to 95% of its original value. Immersion time can vary depending on the pH of the solution. In some embodiments, the immersion time is about 9 minutes (e.g., from 7 minutes to 11 minutes) at 25° C. in a 1 Mol solution of Thiourea with pH of 1. In some embodiments the immersion time is about 25 minutes (e.g., from 23 minutes to 27 minutes) in a 1 Mol solution of Thiourea with pH of 7.

In step 708, a barrier layer is applied to the CIGS layer to prevent further oxidation. The buffer layer 140 can be deposited by chemical deposition (e.g., chemical bath deposition), PVD, ALD, or other suitable techniques. In some embodiments, the buffer layer 140 is applied within the same chamber and/or tool used for the reduction reagent immersion to prevent additional oxidation of the CIGS layer prior to application of the barrier layer. In some embodiments, the solar cell is transferred to a different chamber for application of the barrier layer. During transfer, some oxidation of the CIGS layer may occur. However, as shown in FIG. 2, oxidation of the CIGS layer does not begin immediately after exposure to air. Therefore, transferring the solar wafer from the reduction reagent immersion to a device for barrier layer deposition does not significantly oxidize the CIGS layer.

At step 710, the P2 scribe line if formed through the buffer layer and absorber layer, exposing the back to expose the top surface of the bottom electrode 120 within the open P2 scribe line or channel. Any suitable method can be used to cut the P2 scribe line, including without limitation mechanical (e.g. cutting stylus) or laser scribing.

At step 712, the front contact 150 is formed directly on the buffer layer 140, filling the P2 scribe line. In some embodiments, the step of forming the front contact 150 can include sputtering a layer of i-ZnO or AZO. In other embodiments, the step of forming the front contact 150 can include metal organic CVD (MOCVD) application of a layer of BZO.

At step 714, after front contact layer formation, the P3 scribe lines are next cut through the front contact 150, buffer layer 140 and absorber layer 130 to expose the back contact 120 of the adjacent solar cell.

At step 716, a combination of ethylene vinyl acetate (EVA) and butyl are applied to seal the solar cell 100. The EVA and butyl encapsulant is applied directly onto the top electrode layer 150 in some embodiments. The EVA/butyl act as a suitable light transmitting encapsulant.

At step 718, heat and pressure are applied to laminate the EVA/butyl film to the front contact 150.

At step 720, additional back end of line processes can be performed. This can include laminating a top cover glass onto solar cell structure to protect the top electrode layer 150.

At step 722, suitable further back end processes can then be completed, which can include forming front conductive grid contacts and one or more anti-reflective coatings (not shown) above top electrode 150. The grid contacts protrude upwards through and beyond the top surface of any anti-reflective coatings for connection to external circuits. The solar cell fabrication process produces a finished and complete thin film solar module.

The disclosure generally provides methods and systems for repairing oxidation of CIGS absorber surfaces during manufacture of a CIGS solar cell. Generally, when a CIGS absorber is exposed to atmosphere, oxidation of the CIGS surface occurs and reduces the interface quality of the absorber. The reduced interface quality can be measured by a reduced photoluminescence (PL) intensity. According to embodiments disclosed herein, the absorber is immersed in a reduction reagent to restore the PL intensity of the absorber. The reducing agent reverses the oxidation of the CIGS surface and increases the PL intensity of the absorber. After restoring the CIGS surface, a buffer layer is deposited on the absorber to prevent further surface oxidation.

In some embodiments, a method for manufacturing a photovoltaic device is disclosed. The method comprises the steps of forming a copper/iridium/gallium/selenium (CIGS) absorber structure on a substrate, immersing the CIGS absorber structure in a reduction reagent, and forming a buffer layer on the CIGS layer.

In additional embodiments, a method of restoring a copper/iridium/gallium/selenium (CIGS) absorber is disclosed. The method comprises the steps of preparing a reduction reagent tank comprising a reduction reagent and immersing an oxidized CIGS absorber in the reduction reagent for a predetermined time period.

In additional embodiments, a system for restoring a CIGS layer is disclosed. The system comprises a reduction tank having a reduction agent therein and a buffer layer depositor. The reduction tank is configured to receive an oxidized copper/iridium/gallium/selenium (CIGS) absorber therein. The buffer layer depositor is configured to deposit a buffer layer on the CIGS absorber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a photovoltaic device comprising the steps of:
   forming an absorber layer above a substrate;
   immersing the absorber layer in a reduction reagent, wherein the reduction reagent is configured to react with a surface structure of the absorber layer to desorb oxygen therefrom; and
   forming a buffer layer on the absorber layer.

2. The method of claim 1, wherein the absorber layer comprises a copper/iridium/gallium/selenium (CIGS) absorber layer.

3. The method of claim 2, further comprising the steps of:
adjusting one or more parameters of the reduction reagent, wherein the one or more parameters of the reduction reagent are adjusted prior to immersing the absorber layer in the reduction reagent, and wherein the one or more parameters are adjusted for a predetermined immersion period.

4. The method of claim 3, wherein the one or more parameters comprise at least one of a temperature, a concentration, an immersion time, a pH value, or any combination thereof.

5. The method of claim 4, wherein the temperature is selected within a range of 25° C. to 90° C., the concentration is selected within a range of 0.05M to 5M, the immersion time is selected within a range of 1 minute to 30 minutes, and the pH value is selected within a range of 1 to 7.

6. The method of claim 5, wherein the pH value is selected within a range of 2 to 3.

7. The method of claim 1, wherein the reduction reagent is selected from the group consisting of: sodium sulfite, sodium dithionite, sodium metabisulfite, sodium phosphinate, and thiourea.

8. The method of claim 1, wherein the absorber layer is formed in a vacuum.

9. The method of claim 1, wherein desorb of oxygen from the surface structure of the absorber layer increases photoluminescence of the absorber layer.

10. A method of treating an absorber, comprising the steps of:
providing a reduction reagent tank comprising a reduction reagent; and
immersing a substrate having a previously oxidized absorber in the reduction reagent for a predetermined time period, wherein the reduction reagent is configured to react with a surface of the previously oxidized absorber to desorb oxygen therefrom.

11. The method of claim 10, further comprising selecting the predetermined time period based on one or more parameters of the reduction reagent.

12. The method of claim 11, wherein the one or more parameters of the reduction reagent comprises a predetermined temperature.

13. The method of claim 11, wherein the one or more parameters of the reduction reagent comprises a predetermined pH value.

14. The method of claim 10, wherein reduction reagent comprises a predetermined pH value of less than or equal to a pH of 3.

15. The method of claim 10, wherein the reduction agent is selected from the group consisting essentially of sodium sulfite, sodium dithionite, sodium metabisulfite, sodium phosphinate, and Thiourea.

16. The method of claim 10, wherein the predetermined time period is selected such that the oxidized absorber is restored to a photoluminescence substantially equal to a photoluminescence of an absorber that has not been oxidized.

17. The method of claim 10, further comprising the steps of:
removing the absorber from the reduction tank; and
drying the absorber in a heater.

18. The method of claim 17, further comprising the step of applying a buffer layer to the absorber.

19. A method for manufacturing a photovoltaic device comprising the steps of:
forming an absorber layer above a substrate;
exposing the absorber layer to air, so as to oxidize a surface of the absorber layer;
immersing the absorber layer in a reduction reagent that reacts with the oxidized surface of the absorber layer to desorb oxygen therefrom; and
forming a buffer layer on the absorber layer.

* * * * *